(12) United States Patent
Park

(10) Patent No.: US 7,782,079 B2
(45) Date of Patent: Aug. 24, 2010

(54) APPARATUS AND METHOD OF CALIBRATING ON-DIE TERMINATION FOR SEMICONDUCTOR INTEGRATED CIRCUIT

(75) Inventor: Nak-Kyu Park, Ichon (KR)

(73) Assignee: Hynix Semiconductor Inc. (KR)

( * ) Notice: Subject to any disclaimer, the term of this patent is extended or adjusted under 35 U.S.C. 154(b) by 84 days.

(21) Appl. No.: 12/181,876

(22) Filed: Jul. 29, 2008

(65) Prior Publication Data

US 2009/0121742 A1 May 14, 2009

(30) Foreign Application Priority Data

Nov. 9, 2007 (KR) .................. 10-2007-0114371

(51) Int. Cl.
*H03K 19/003* (2006.01)
(52) U.S. Cl. ..................... 326/30; 326/86; 327/108
(58) Field of Classification Search .............. 326/30, 326/86; 327/108
See application file for complete search history.

(56) References Cited

U.S. PATENT DOCUMENTS

| 6,924,660 | B2 | 8/2005 | Nguyen et al. | |
|---|---|---|---|---|
| 6,980,020 | B2 | 12/2005 | Best et al. | |
| 7,170,313 | B2 | 1/2007 | Shin | |
| 7,176,711 | B2 * | 2/2007 | Park et al. | 326/30 |
| 7,230,448 | B2 * | 6/2007 | Choe | 326/30 |
| 7,268,712 | B1 * | 9/2007 | Sheen | 341/120 |
| 7,400,165 | B2 * | 7/2008 | Park | 326/30 |
| 2005/0242833 | A1 * | 11/2005 | Park et al. | 326/30 |
| 2007/0236248 | A1 | 10/2007 | Park | |
| 2008/0048714 | A1 * | 2/2008 | Lee et al. | 326/30 |
| 2008/0252332 | A1 * | 10/2008 | Lee et al. | 326/30 |
| 2008/0284467 | A1 * | 11/2008 | Koo | 326/30 |

FOREIGN PATENT DOCUMENTS

| JP | 2007-164979 | 6/2007 |
|---|---|---|
| KR | 10-1999-0060759 | 7/1999 |
| KR | 1020040095912 | 11/2004 |

* cited by examiner

*Primary Examiner*—Vibol Tan
(74) *Attorney, Agent, or Firm*—Baker & McKenzie LLP

(57) ABSTRACT

An apparatus for calibrating on-die termination for a semiconductor integrated circuit includes a comparing unit that compares a code conversion voltage, which is obtained by converting an internal code into an analog voltage, with a reference voltage, and outputs a comparison result signal, a code control unit that compares a current comparison result signal and a previous comparison result signal, among comparison result signals obtained by sequential comparison operations by the comparing unit, to determine whether or not the levels thereof are the same, and outputs an external code update signal according to the comparison result, and a counter that increases or decreases the internal code according to the comparison result signal and outputs the internal code as an external code according to the external code update signal.

11 Claims, 6 Drawing Sheets

APPARATUS AND METHOD OF CALIBRATING ON-DIE TERMINATION FOR SEMICONDUCTOR INTEGRATED CIRCUIT

CROSS-REFERENCE TO RELATED PATENT APPLICATION

This application claims the benefit under 35 U.S.C. 119(a) of Korean Patent Application No. 10-2007-0114371, filed on Nov. 9, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit, and more particularly, to an apparatus and method of calibrating on-die termination for a semiconductor integrated circuit.

2. Related Art

A conventional apparatus for calibrating on-die termination for a semiconductor integrated circuit includes an operation control unit 10, a driver leg 20, a comparing unit 30, an internal code control unit 40, a first counter 50, and a second counter 60, as shown in FIG. 1.

The operation control unit 10 generates various operation control signals, which includes a calibration enable signal 'cal_enable', a first amp enable signal '1'st_amp_en', a second amp enable signal '2'nd_amp_en', a second calibration enable signal 'second_cmp_en', an internal code pre-update signal 'internal_regp', and a final code update signal 'final_regp', at predetermined timing according to an on-die termination calibration command 'odt_calp'. The operation control unit 10 may be composed of an oscillator and a counter.

The driver leg 20 has a structure that functions as an analog/digital converter, and distributes a power supply voltage with a distribution ratio between resistance selected according to an internal code 'P<0:n>' and external resistance RQ and outputs a code conversion voltage (zq).

The comparing unit 30 compares the code conversion voltage (zq) with a reference voltage (VREF) according to the first amp enable signal '1'st_amp_en' and the second amp enable signal '2'nd_amp_en', and outputs a comparison result signal 'comparator_out'.

The internal code control unit 40 receives the calibration enable signal 'cal_enable', the first amp enable signal '1'st_amp_en', the second comparison output enable signal 'second_cmp_en', the internal code pre-update signal 'internal_regp', and the comparison result signal 'comparator_out' and outputs an internal code update signal 'second_regp'. As shown in FIG. 2, the internal code control unit 40 includes a flip flop DFF, an XOR gate XOR1, first and second inverters IV1 and IV2, and first and second NAND gates ND1 and ND2.

The first counter 50 counts the internal code 'P<0:n>' according to the internal code update signal 'second_regp' and the comparison result signal 'comparator_out' and outputs it.

The second counter 60 counts the internal code 'P<0:n>' according to the final code update signal 'final_regp' or a test mode signal 'TMs' and outputs an external code 'P_LEG<0:n>'. The test mode signal 'TMs' is used in a test operation, not in a normal operation. If the test mode signal 'TMs' is activated, it is possible to set the external code 'P_LEG<0:n>' to a predetermined value.

The operation of a conventional apparatus for calibrating on-die termination for a semiconductor integrated circuit will be described below with reference to FIG. 3.

First, if a system stabilization signal 'RES' is activated, an initial on-die termination calibration operation (hereinafter, initial calibration operation) is performed during a predetermined period. Then, a normal on-die termination calibration operation (hereinafter, normal calibration operation) is performed according to a specific command, for example, an auto refresh command. A system outside the semiconductor integrated circuit detects that a voltage and a clock are stably provided and activates the system stabilization signal 'RES'.

The initial calibration operation is repeatedly performed, for example, several tens of times. The number of times N of the initial calibration operation may be changed according to a circuit design.

If an on-die termination calibration command 'odt_calp' is generated once according to the system stabilization signal 'RES' or the auto refresh command, the operation control unit 10 shown in FIG. 1 generates the calibration enable signal 'cal_enable', the first amp enable signal '1'st_amp_en', the second amp enable signal '2'nd_amp_en', the second calibration enable signal 'second_cmp_en', the internal code pre-update signal 'internal_regp', and the final code update signal 'final_regp' at the predetermined timing.

The calibration enable signal 'cal_enable' indicates a point of time when the initial calibration operation is performed and an interval in which the initial calibration operation is performed, and the interval is restricted by a refresh cycle time tRFC. The refresh cycle time tRFC is the predetermined time for continuous input of a command and the auto refresh command, after the system stabilization signal 'RES' is activated.

The driver leg 20 outputs the code conversion voltage (zq) according to the internal code 'P<0:n>' having an initial value.

The comparing unit 30 compares the code conversion voltage (zq) with the reference voltage (VREF) according to the first amp enable signal '1'st_amp_en' and the second amp enable signal '2'nd_amp_en', which are generated two times in the interval of the calibration enable signal 'cal_enable', and outputs the comparison result signal 'comparator_out' at a high level or a low level.

Since the first amp enable signal '1'st_amp_en' and the second amp enable signal '2'nd_amp_en' are generated two times in the interval of the calibration enable signal 'cal_enable', the comparison operation by the comparing unit 30 is performed two times.

If the comparing unit 30 performs the first comparison operation, the internal code control unit 40 shown in FIG. 2 generates the first internal code update signal 'second_regp' according to the second calibration enable signal 'second_cmp_en' and the internal code pre-update signal 'internal_regp'. If the comparing unit 30 performs the second comparison operation and the comparison result signals 'comparator_out', which the comparing unit 30 outputs after performing the comparison operation two times, are at the same level, then the internal code control unit 40 prohibits the second internal code update signal 'second_regp' from being generated. In contrast, if the comparing unit 30 performs the second comparison operation and the comparison result signals 'comparator_out', which the comparing unit 30 outputs after performing the comparison operation two times, are at different levels, then the internal code control unit 40 allows the second internal code update signal 'second_regp' to be generated.

If the internal code update signal 'second_regp' is generated, then the first counter 50 increases or decreases the internal code 'P<0:n>' by 1 step according to the comparison result signal 'comparator_out'.

If the final code update signal 'final_regp' is generated, then the second counter 60 outputs the internal code 'P<0:n>' as the external code 'P_LEG<0:n>'.

On-die termination calibration of a command and address circuit and a data input/output circuit is performed according to the external code 'P_LEG_<0:n>'.

If the comparison result signals 'comparator_out', which the comparing unit 30 outputs after performing the comparison operation two times, are at the same level, then the internal code update signal 'second_regp' is generated once, and thus, the external code 'P_LEG<0:n>' increases or decreases by 1 step. However, if the comparison result signals 'comparator_out', which the comparing unit 30 outputs after performing the comparison operation two times, are respectively at the different levels, then the internal code update signal 'second_regp' is generated two times, and the external code 'P_LEG<0:n>' increases or decreases. As a result, the external code 'P_LEG<0:n>' maintains the same value.

In a conventional apparatus, in a normal calibration interval shown in FIG. 3 where a normal calibration operation is performed, a minimum interval min_2*cal* where on-die termination calibration is performed two times according to the auto refresh command Auto Ref is two long, and may exceed the interval of the refresh cycle time tRFC. This occurs due to the change in various operation conditions, such as a decrease in the operation preparation time (initial timing) of the semiconductor integrated circuit to perform the initial calibration operation, a decrease in a product operation voltage, and a decrease in the refresh cycle time tRFC. In this case, a normal calibration operation cannot be performed.

A conventional apparatus for calibrating on-die termination for a semiconductor integrated circuit has been described above has the following problems: First, when the voltage difference between the code conversion voltage (zq) and the reference voltage (VREF) is large at during initial operation, the calibration operation is performed two times according to a one-time on-die termination calibration command 'odt_calp', but the code updating is only made by 1 step. Accordingly, it takes a long time to adjust the voltage difference between the code conversion voltage (zq) and the reference voltage (VREF) to the offset margin of the comparing unit 30.

Second, it takes a long time to perform the on-die termination calibration operation. Since the on-die termination calibration operation is restricted by the refresh cycle time tRFC, it is difficult to perform the normal calibration operation within the period of the refresh cycle time tRFC.

Third, since it is difficult to perform a normal calibration operation while keeping the predetermined refresh cycle time tRFC, the on-die termination calibration operation according to the auto refresh command may be omitted. However, in this case, in the normal operation state, since the change in the voltage and the temperature is not reflected, and the operation performance of the semiconductor integrated circuit can be adversely affected.

SUMMARY

An apparatus and method of calibrating on-die termination for a semiconductor integrated circuit that is capable of decreasing a calibration time without being restricted by a refresh cycle time tRFC is described herein.

According to one aspect, an apparatus for calibrating on-die termination for a semiconductor integrated circuit includes a comparing unit that compares a code conversion voltage, which is obtained by converting an internal code into an analog voltage, with a reference voltage, and outputs a comparison result signal, a code control unit that compares a current comparison result signal and a previous comparison result signal, among comparison result signals obtained by sequential comparison operations by the comparing unit, to determine whether or not the levels thereof are the same, and outputs an external code update signal according to the comparison result, and a counter that increases or decreases the internal code according to the comparison result signal and outputs the internal code as an external code according to the external code update signal.

According to another aspect, a method of calibrating on-die termination for a semiconductor integrated circuit includes performing an on-die termination calibration operation during a period where an on-die termination calibration command is activated, comparing a current on-die termination calibration operation result value with a previous on-die termination calibration operation result value, and changing an on-die termination resistance value according to the comparison result.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
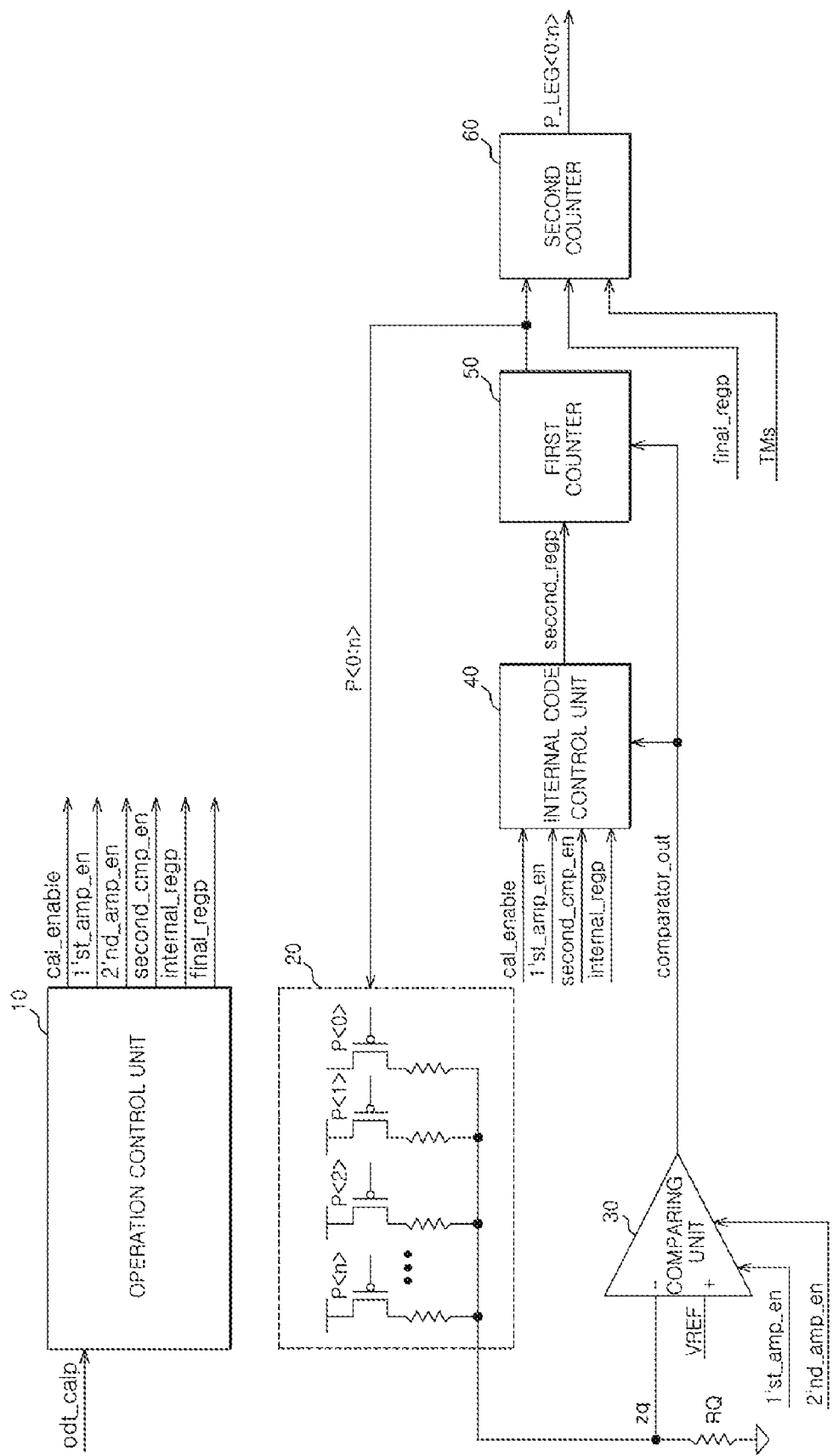
FIG. 1 is a block diagram illustrating an exemplary apparatus for calibrating on-die termination for a semiconductor integrated circuit.
Figure 2:
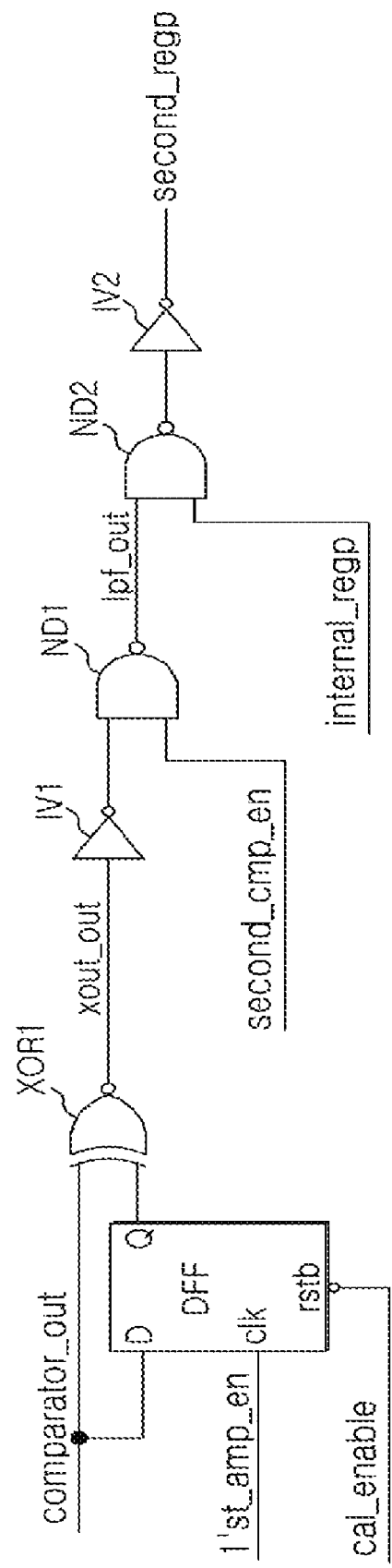
FIG. 2 is a circuit diagram of a code control unit that can be included in the apparatus shown in FIG. 1.
Figure 3:
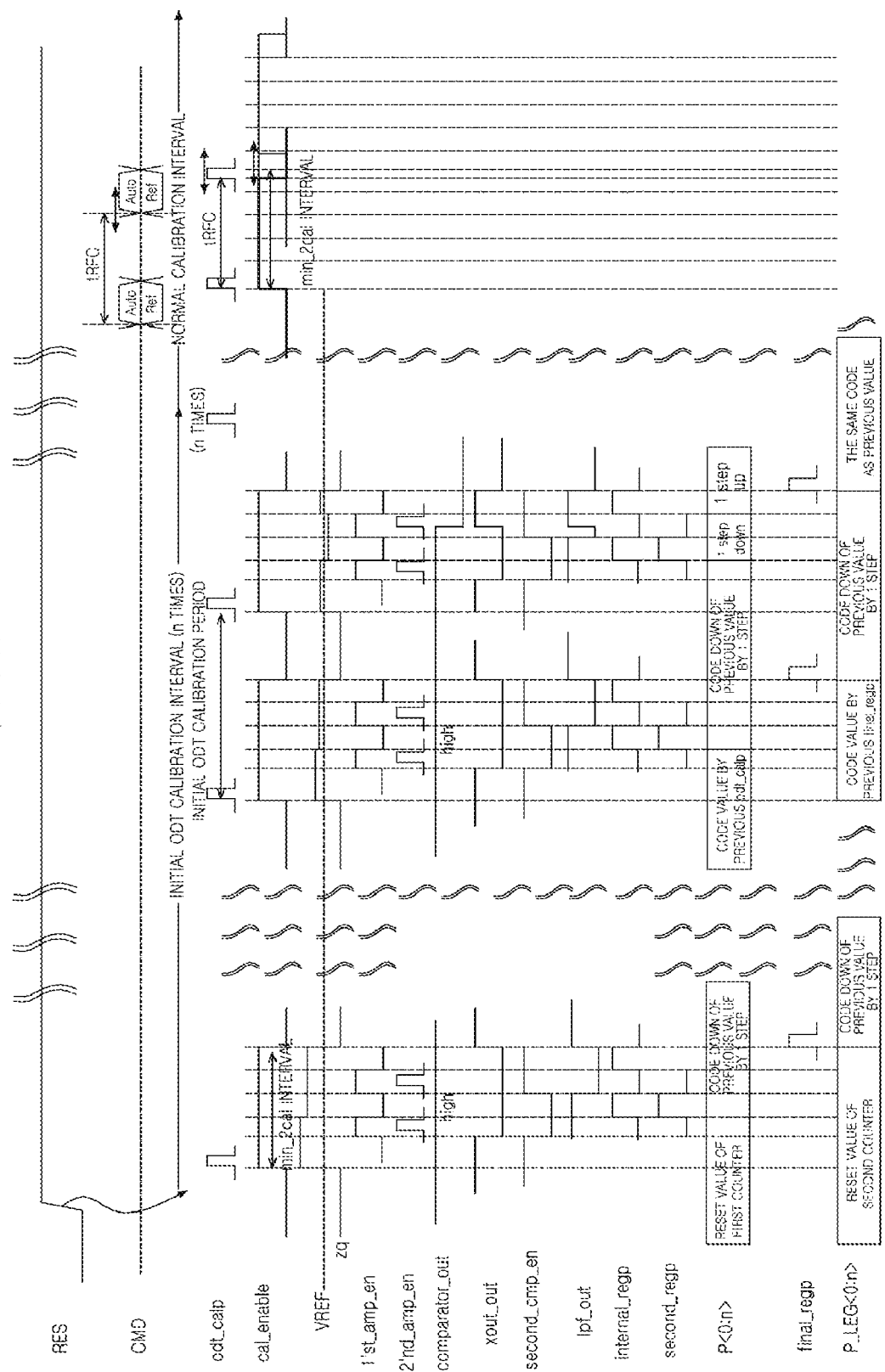
FIG. 3 is a timing diagram illustrating the operation of the apparatus for calibrating on-die termination for a semiconductor integrated circuit shown in FIG. 1.
Figure 4:
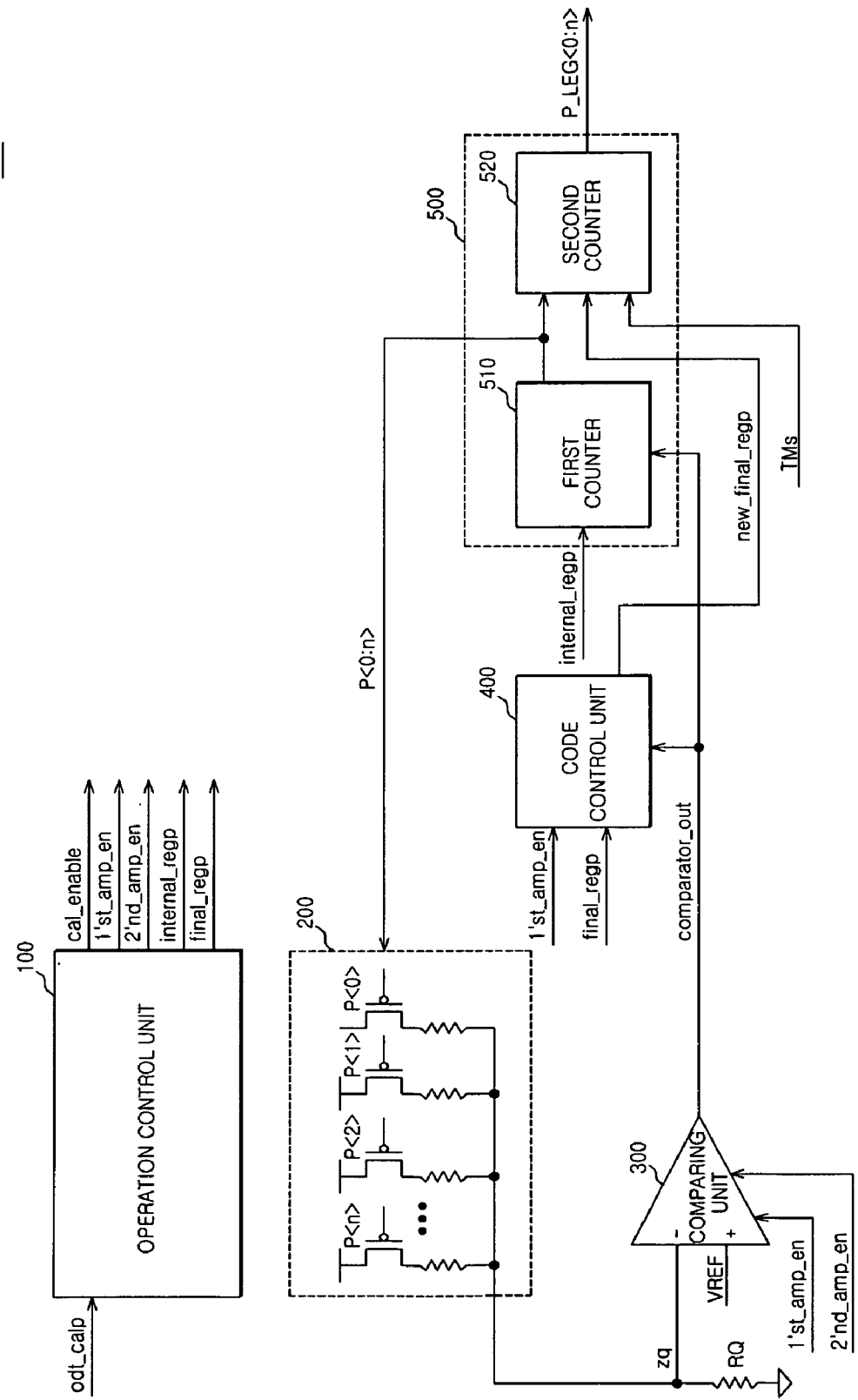
FIG. 4 is a block diagram illustrating an apparatus for calibrating on-die termination for a semiconductor integrated circuit according to one embodiment.

FIG. 4 is a diagram illustrating an example apparatus 101 for calibrating on-die termination configured in accordance with one embodiment. Referring to FIG. 4, the apparatus 101 can include an operation control unit 100, a driver leg 200, a comparing unit 300, a code control unit 400, and a counter 500. In this case, the counter 500 can include a first counter 510 and a second counter 520.

Figure 6:
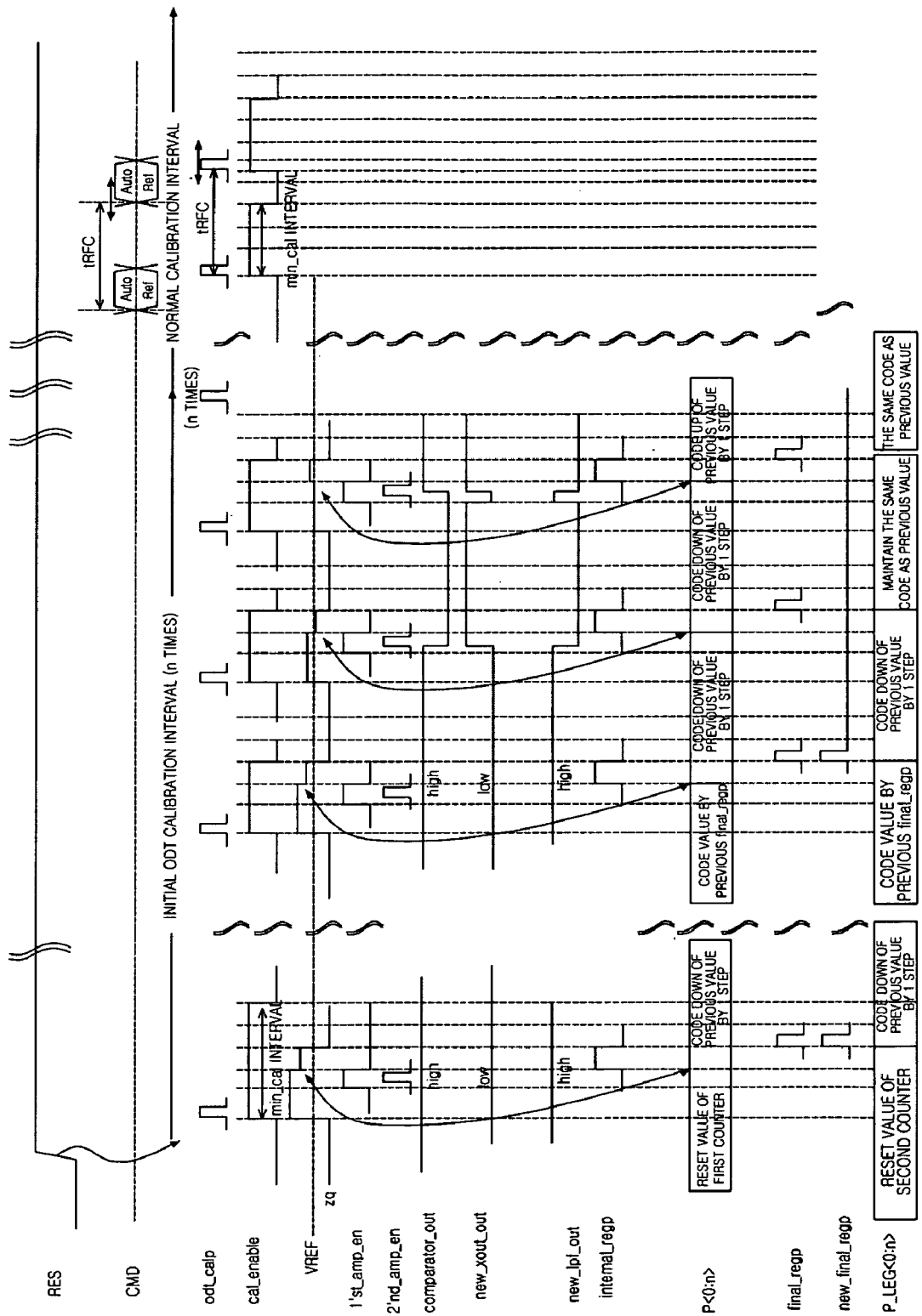
FIG. 6 is a timing diagram illustrating the operation of the apparatus for calibrating on-die termination for a semiconductor integrated circuit shown in FIG. 4.

The operation control unit 100 can be configured to generate various operation control signals, which include a calibration enable signal 'cal_enable', a first amp enable signal '1'st_amp_en', a second amp enable signal '2'nd_amp_en', an internal code pre-update signal 'internal_regp', and a final code update signal 'final_regp', at predetermined timing according to an on-die termination calibration command 'odt_calp'. The operation control unit 100 can include an oscillator and a counter. The operation control unit 100 can be configured to control output signals of the oscillator and the counter in order that each of the first amp enable signal '1'st_amp_en', the second amp enable signal '2'nd_amp_en', and the internal code pre-update signal 'internal_regp' is generated once for one cycle of the calibration enable signal 'cal_enable', as shown in FIG. 6.

The driver leg 200 can function as an analog/digital converter, and can be configured to distribute a power supply voltage with a distribution ratio between resistance selected according to an internal code 'P<0:n>' and external resistance RQ and output a code conversion voltage (zq).

The comparing unit 300 can be configured to compare the code conversion voltage (zq) with a reference voltage (VREF) according to the first amp enable signal '1'st_amp_en' and the second amp enable signal '2'nd_amp_en', and output a comparison result signal 'comparator_out'.

The code control unit 400 can be configured to compare a current comparison result signal and a previous comparison result signal among the comparison result signals 'comparator_out', which are obtained by the sequential comparison operations performed by the comparing unit 300, to determine whether or not the levels thereof are the same, and output an external code update signal 'new_final_regp' according to the comparison result. The code control unit 400 can receive the first amp enable signal '1'st_amp_en', the final code update signal 'final_regp', and the comparison result signal 'comparator_out', and output the external code update signal new_'final_regp'.

The counter 500 can increase or decrease the internal code 'P<0:n>' according to the comparison result signal 'comparator_out', and receive the internal code 'P<0:n>' that has increased or decreased according to the external code update signal 'new_final_regp' and output it as the external code 'P_LEG<0:n>'. As described above, the counter 500 can include the first counter 510 and the second counter 520. The first counter 510 can increase or decrease the internal code 'P<0:n>' to correspond to the comparison result signal 'comparator_out' according to the internal code pre-update signal 'internal_regp'. The second counter 520 can receive the internal code 'P<0:n>' that has increased or decreased according to the external code update signal 'new_final_regp' and output it as the external code 'P_LEG<0:n>'.

Figure 5:
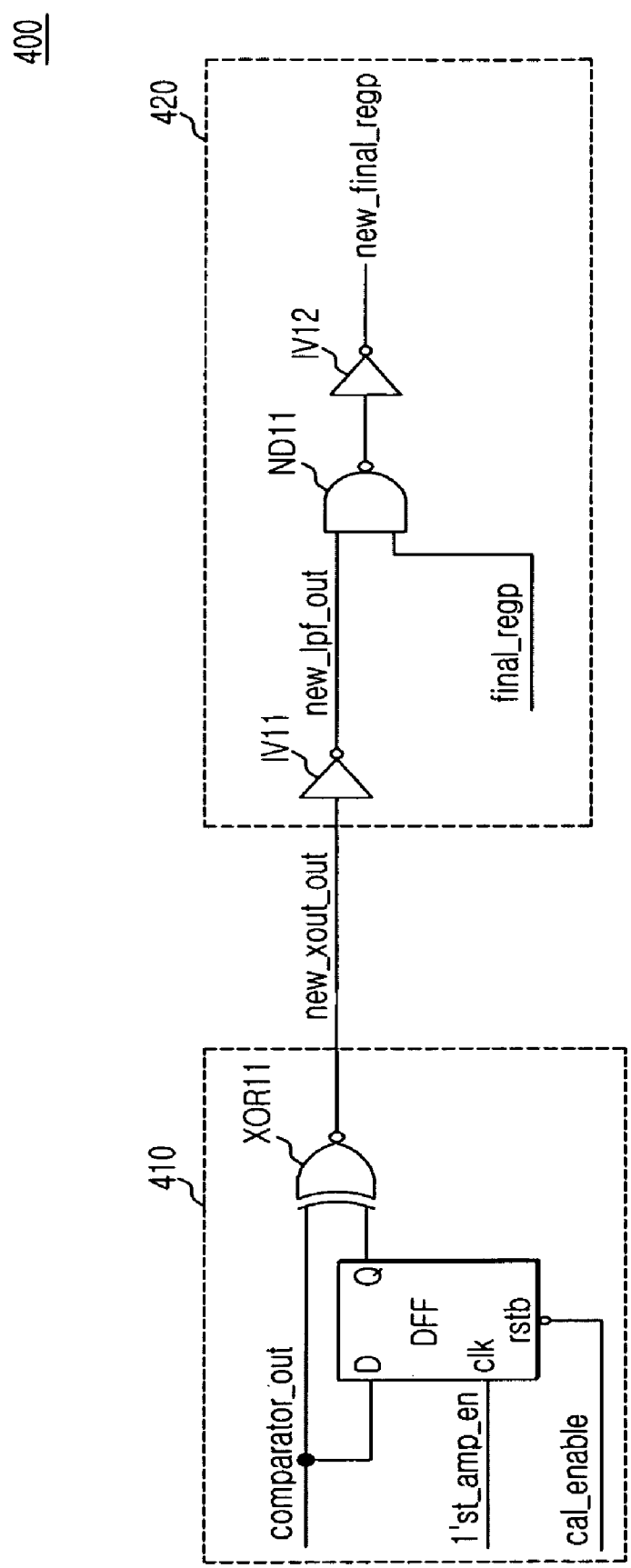
FIG. 5 is a circuit diagram of a code control unit that can be included in the apparatus shown in FIG. 4.

As shown in FIG. 5, the code control unit 400 can include a comparison circuit 410 and a determination circuit 420.

The comparison circuit 410 can be configured to compare the current comparison result signal with the previous comparison result signal to determine whether or not the levels thereof are the same. Specifically, the comparison circuit 410 can be configured to compare the previous comparison result signal 'comparator_out', which is latched by a D flip flop DFF according to the first amp enable signal '1'st_amp_en', with the current comparison result signal 'comparator_out' to determine whether or not the levels thereof are the same. Specifically, the comparison circuit 410 can include a D flip flop DFF that has a clock terminal clk receiving the first amp enable signal '1'st_amp_en' and an input terminal D receiving the comparison result signal 'comparator_out', and an XOR gate XOR1 that performs an XOR operation on an output signal of the D flip flop DFF and the comparison result signal 'comparator_out', and outputs a same level comparison signal new_xout_out.

The determination circuit 420 can be configured to determine whether or not to output the external code update signal 'new_final_regp' according to the output signal of the comparison circuit 410. The determination circuit 420 can include a first inverter IV11, a NAND gate ND11, and a second inverter IV12. In this case, the first inverter IV11 can receive the same level comparison signal 'new_xout_out', and the NAND gate ND11 can receive an output signal 'new_lpf_out' of the first inverter IV11 and the final code update signal 'final_regp'. The second inverter IV12 can invert the output signal of the NAND gate ND11 and output the external code update signal 'new_final_regp'.

Hereinafter, a method of calibrating on-die termination of the semiconductor integration circuit that has the above-described structure will be described.

First, if a system stabilization signal 'RES' is activated, then an initial on-die termination calibration operation (hereinafter, initial calibration operation) can be performed during a predetermined period. Then, a normal on-die termination calibration operation (hereinafter, normal calibration operation) can be performed according to a specific command, for example, an auto refresh command.

The initial calibration operation can be repeatedly performed, for example, several tens of times.

If the on-die termination calibration command 'odt_calp' is generated once according to the system stabilization signal 'RES' or the auto refresh command, then the operation control unit 100 shown in FIG. 4 can generate, at a predetermined time, the calibration enable signal 'cal_enable', the first amp enable signal '1'st_amp_en', the second amp enable signal '2'nd_amp_en', the internal code pre-update signal 'internal_regp', and the final code update signal 'final_regp'.

The driver leg 200 can output the code conversion voltage (zq) according to the internal code 'P<0:n>'.

The comparing unit 300 can compare the code conversion voltage (zq) with the reference voltage (VREF) according to the first amp enable signal '1'st_amp_en' and the second amp enable signal '2'nd_amp_en', which are generated once in the interval of the calibration enable signal 'cal_enable', and output the comparison result signal 'comparator_out' at a high level or a low level.

Since the first amp enable signal '1'st_amp_en' and the second amp enable signal '2'nd_amp_en' are generated once in the interval of the calibration enable signal 'cal_enable', the comparing unit 300 performs a comparison operation once.

The comparison circuit 410 of the code control unit 400 shown in FIG. 5 compares the previous comparison result signal 'comparator_out' with the current comparison result signal 'comparator_out' and outputs the same level comparison signal 'new_xout_out'. If the previous comparison result signal 'comparator_out' and the current comparison result signal 'comparator_out' are at the same level, the comparison circuit 410 outputs the same level comparison signal 'new_xout_out' at a low level and otherwise, outputs the same level comparison signal 'new_xout_out' at a high level.

If the same level comparison signal 'new_xout_out' is at a low level, then the determination circuit 420 shown in FIG. 5 generates the external code update signal 'new_final_regp' at timing at which the final code update signal 'final_regp' is generated.

If the internal code pre-update signal 'internal_regp' is generated, then the first counter 510 shown in FIG. 4 increases or decreases the internal code 'P<0:n>' by 1 step to correspond to the comparison result signal 'comparator_out'. The internal code pre-update signal 'internal_regp' is generated once in the interval of the calibration enable signal 'cal_enable', like the first amp enable signal '1'st_amp_en' and the second amp enable signal '2'nd_amp_en'. Accordingly, the internal code 'P<0:n>' can be updated whenever the comparison operation performed by the comparing unit 300 is completed, regardless of the operation of the code control unit 400.

If the external code update signal 'new_final_regp' is generated, then the second counter 520 can receive the internal code 'P<0:n>' that has increased or decreased in the first counter 510 and output it as the external code 'P_LEG<0:n>'.

Meanwhile, it is assumed that although the code conversion voltage (zq) is first higher than the reference voltage (VREF), as the on-die termination calibration is repeatedly performed, the code conversion voltage (zq) becomes lower than the reference voltage (VREF). That is, the voltage difference between the code conversion voltage (zq) and the reference voltage (VREF) is within the offset margin of the comparing unit 30. In this case, since the decreased level of the code conversion voltage (zq) needs to be increased, the previous comparison result signal 'comparator_out' and the current comparison result signal 'comparator_out' have different levels. Since the previous comparison result signal 'comparator_out' and the current comparison result signal 'comparator_out' are at the different levels, the comparison circuit 410 outputs the same level comparison signal 'new_x-out_out' at a high level.

If the same level comparison signal 'new_xout_out' is at a high level, then the determination circuit 420 shown in FIG. 5 prohibits the external code update signal 'new_final_regp' from being generated, regardless of whether the final code update signal 'final_regp' is generated or not.

If the external code update signal 'new_final_regp' is not generated, then the second counter 520 does not receive the internal code 'P<0:n>' that has increased or decreased in the first counter 510, and continuously outputs the previous external code 'P_LEG<0:n>'. That is, since the on-die termination calibration is completed, the external code 'P_LEG<0:n>' is no longer changed.

On-die termination calibration of a command and address circuit and a data input/output circuit is performed according to the external code 'P_LEG_<0:n>'.

As shown in FIG. 6, when a normal calibration operation is performed, a minimum interval min_cal during which on-die termination calibration is performed once according to a one-time auto refresh command 'Auto Ref' can be shortened. It can be seen that sufficient margin is ensured in the interval of the refresh cycle time tRFC. Accordingly, the on-die termination calibration can be performed normally not only in the initial operation interval but also in the normal operation interval.

Accordingly, since it is possible to reduce the time required to perform each of the plurality of calibration operations, a normal calibration operation can be performed regardless of the refresh cycle time tRFC. Also, it is possible to reduce the time required to perform the entire calibration operation. Further, a comparison operation can be performed once for each of the plurality of calibration operations. When calibration is performed within the offset margin of the comparing unit, the code actually used in the external circuit is no longer changed. Therefore, unnecessary power consumption can be reduced, and the circuit structure can be simplified.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An apparatus for calibrating on-die termination for a semiconductor integrated circuit, the apparatus comprising:
   an operation control unit that generates an amp enable signal and a final code update signal in response to an on-die termination calibration command;
   a comparing unit that compares a code conversion voltage with a reference voltage, and outputs a comparison result signal in response to the amp enable signal;
   a code control unit that compares a current comparison result signal and a previous comparison result signal and outputs an external code update signal in response to the final code update signal;
   a first counter that changes an internal code in response to the comparison result signal; and
   a second counter that outputs an external code in response to the external code update signal and the internal code.

2. The apparatus of claim 1, further comprising:
   a driver leg that distributes a power supply voltage according to a distribution ratio between resistance selected according to the internal code and external resistance and generates the code conversion voltage.

3. The apparatus of claim 1,
   wherein the comparing unit includes an amplifier that operates according to the amp enable signal.

4. The apparatus of claim 1,
   wherein the code control unit includes:
   a comparison circuit that compares the current comparison result signal with the previous comparison result signal to determine whether or not levels thereof are the same; and
   a determination circuit that determines whether or not to output the external code update signal according to an output signal of the comparison circuit.

5. The apparatus of claim 4,
   wherein the comparison circuit latches the previous comparison result signal and compares the previous comparison result signal with the current comparison result signal.

6. The apparatus of claim 5,
   wherein the comparison circuit latches the previous comparison result signal until the current comparison result signal is input, according to the amp enable signal.

7. The apparatus of claim 6,
   wherein the comparison circuit includes:
   a flip flop that has a clock terminal receiving the amp enable signal and an input terminal receiving the comparison result signal; and
   a logic gate that performs an XOR operation on an output signal of the flip flop and the comparison result signal.

8. The apparatus of claim 4,
   wherein the determination circuit includes a logic gate that performs an AND operation on the output signal of the comparison circuit and an external code update signal according to each comparison operation performed by the comparing unit.

9. The apparatus of claim 1,
   wherein
   the operation control unit is configured to generate the amp enable signal once for each cycle of calibration operations.

10. The apparatus of claim 1,
    wherein the code control unit is configured to output the final code update signal as the external update signal in response to the comparison result signal.

11. The apparatus of claim 1,
    wherein the code control unit is configured to prohibit the external code update signal from being enabled when the current comparison result signal and the previous comparison result signal are not the same.

* * * * *